(12) United States Patent
Liu et al.

(10) Patent No.: US 11,101,163 B2
(45) Date of Patent: Aug. 24, 2021

(54) SYSTEMS AND METHODS FOR AUTOMATED ROBOTIC ARM SENSING

(71) Applicant: Taiwan Semiconductor Manufacturing Co., Ltd., Hsinchu (TW)

(72) Inventors: Yan-Hong Liu, Zhudong Township, Hsinchu County (TW); Hung-Wen Chen, Hsin-Chu (TW); Che-Fu Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 96 days.

(21) Appl. No.: 16/189,908

(22) Filed: Nov. 13, 2018

(65) Prior Publication Data
US 2019/0237354 A1 Aug. 1, 2019

Related U.S. Application Data

(60) Provisional application No. 62/623,926, filed on Jan. 30, 2018.

(51) Int. Cl.
*H01L 21/687* (2006.01)
*H01L 21/67* (2006.01)
(Continued)

(52) U.S. Cl.
CPC ........ *H01L 21/68707* (2013.01); *B25J 15/08* (2013.01); *B65G 47/90* (2013.01);
(Continued)

(58) Field of Classification Search
CPC .... B25J 15/08; B65G 47/90; H01L 21/68707; H01L 21/67167; H01L 21/67173;
(Continued)

(56) References Cited

U.S. PATENT DOCUMENTS

| 6,813,543 | B2 | 11/2004 | Aalund et al. |
| 8,224,607 | B2 | 7/2012 | Sakhare et al. |

(Continued)

FOREIGN PATENT DOCUMENTS

| TW | 200418701 A | 10/2004 |
| TW | 200918264 A | 5/2009 |

OTHER PUBLICATIONS

Official Action dated Jul. 2, 2019, in corresponding Taiwan Patent Application No. 10820625250.
(Continued)

*Primary Examiner* — Saul Rodriguez
*Assistant Examiner* — Ashley K Romano
(74) *Attorney, Agent, or Firm* — Duane Morris LLP

(57) ABSTRACT

In an embodiment, a system includes: an airlock; a first semiconductor processing chamber, a second semiconductor processing chamber; and a transfer module configured to move a sensor into and out of the first semiconductor processing chamber and the second semiconductor processing chamber, wherein the sensor is configured to: collect sensor data characterizing the first semiconductor processing chamber when within the first semiconductor processing chamber; and collect sensor data characterizing the second semiconductor processing chamber when within the second semiconductor processing chamber, wherein the transfer module, the first semiconductor processing chamber, and the second semiconductor processing chamber are within a controlled internal atmosphere on a first side of the airlock and separated by the airlock from an uncontrolled external atmosphere on a second side of the airlock.

20 Claims, 11 Drawing Sheets

(51) Int. Cl.
  *B25J 15/08* (2006.01)
  *B65G 47/90* (2006.01)
  *H01L 21/677* (2006.01)
(52) U.S. Cl.
  CPC .. *H01L 21/67167* (2013.01); *H01L 21/67173* (2013.01); *H01L 21/67201* (2013.01); *H01L 21/67248* (2013.01); *H01L 21/67253* (2013.01); *H01L 21/67259* (2013.01); *H01L 21/67288* (2013.01); *H01L 21/67742* (2013.01); *H01L 21/67748* (2013.01)
(58) Field of Classification Search
  CPC ......... H01L 21/67201; H01L 21/67248; H01L 21/67253; H01L 21/67259; H01L 21/67288; H01L 21/67742; H01L 21/67748
  See application file for complete search history.

(56) References Cited

U.S. PATENT DOCUMENTS

| | | | | |
|---|---|---|---|---|
| 9,337,014 | B1* | 5/2016 | Galburt | H01L 21/67201 |
| 10,679,379 | B1* | 6/2020 | Diankov | G06K 9/00664 |
| 2007/0059130 | A1* | 3/2007 | Flitsch | B23P 19/04 |
| | | | | 414/217 |
| 2015/0214083 | A1* | 7/2015 | Kawakami | H01L 21/67248 |
| | | | | 156/345.27 |
| 2015/0314325 | A1* | 11/2015 | Ko | H01L 21/67248 |
| | | | | 427/558 |
| 2015/0329970 | A1* | 11/2015 | Khan | H01L 21/67778 |
| | | | | 118/719 |
| 2017/0186633 | A1* | 6/2017 | Kamiya | H01L 21/67373 |
| 2018/0286728 | A1* | 10/2018 | Moura | B25J 11/0095 |
| 2018/0308680 | A1* | 10/2018 | Reddy | C23C 16/45542 |
| 2019/0176326 | A1* | 6/2019 | Bingham | B25J 9/161 |
| 2019/0339119 | A1* | 11/2019 | Tamatsukuri | H01L 21/677 |
| 2019/0393056 | A1* | 12/2019 | Hirochi | H01L 21/67781 |

OTHER PUBLICATIONS

Martinez, A.M., "Mechanical design of a robot's gripper", Jun. 2015, Technical Paper, 103 pages.

* cited by examiner

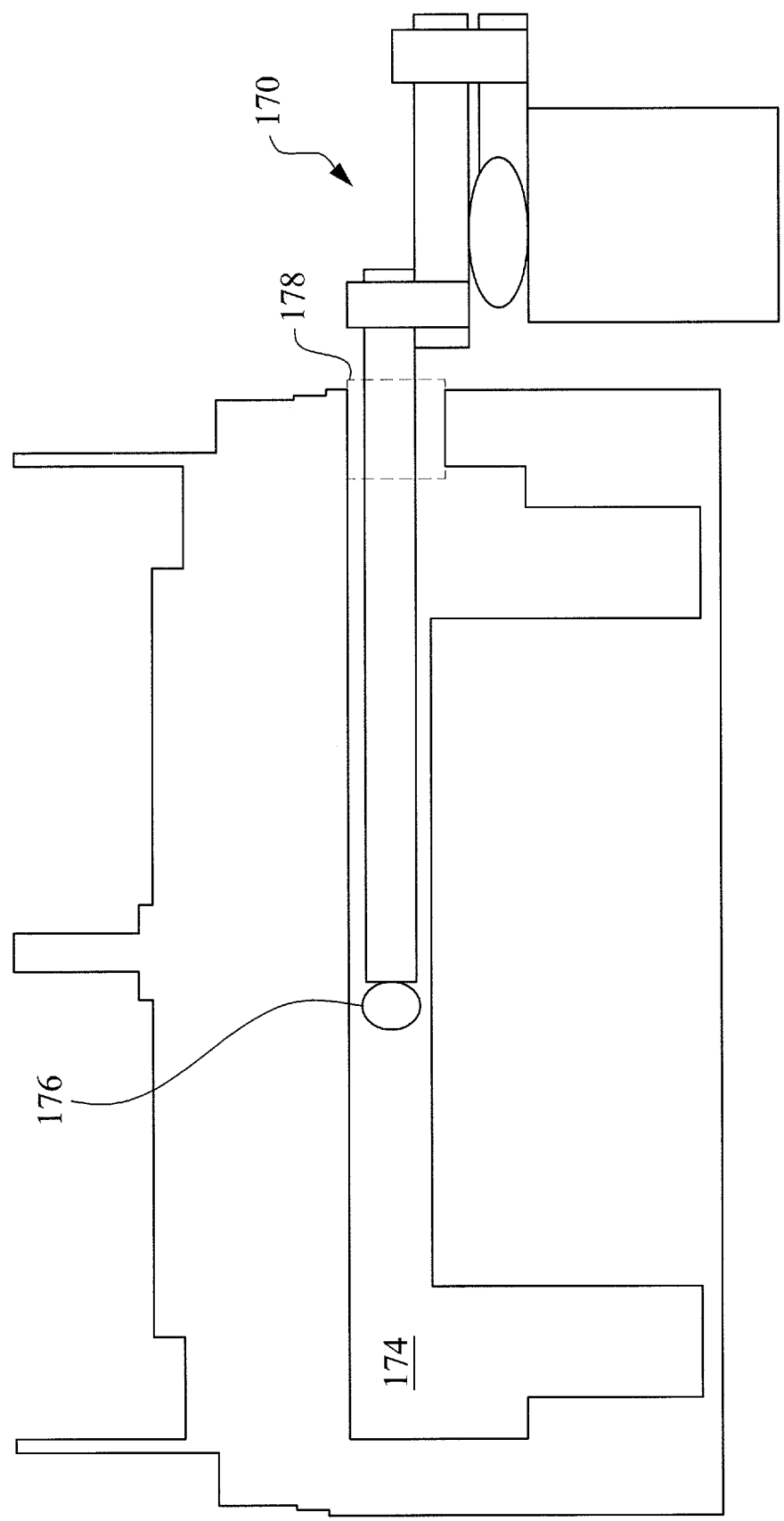

SYSTEMS AND METHODS FOR AUTOMATED ROBOTIC ARM SENSING

CROSS-REFERENCE TO RELATED APPLICATION

The present application claims priority to U.S. Provisional Patent Application No. 62/623,926, filed on Jan. 30, 2018, which is incorporated by reference herein in its entirety.

BACKGROUND

Modern manufacturing processes are typically highly automated to manipulate materials and devices and create a finished product. Quality control and maintenance processes often rely on human skill, knowledge and expertise for inspection of the manufactured product both during manufacture and as a finished product.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIG. 1C is a cross sectional view of a robotic arm reaching into a semiconductor processing chamber, in accordance with some embodiments.

DETAILED DESCRIPTION OF EXEMPLARY EMBODIMENTS

Figure 1A:
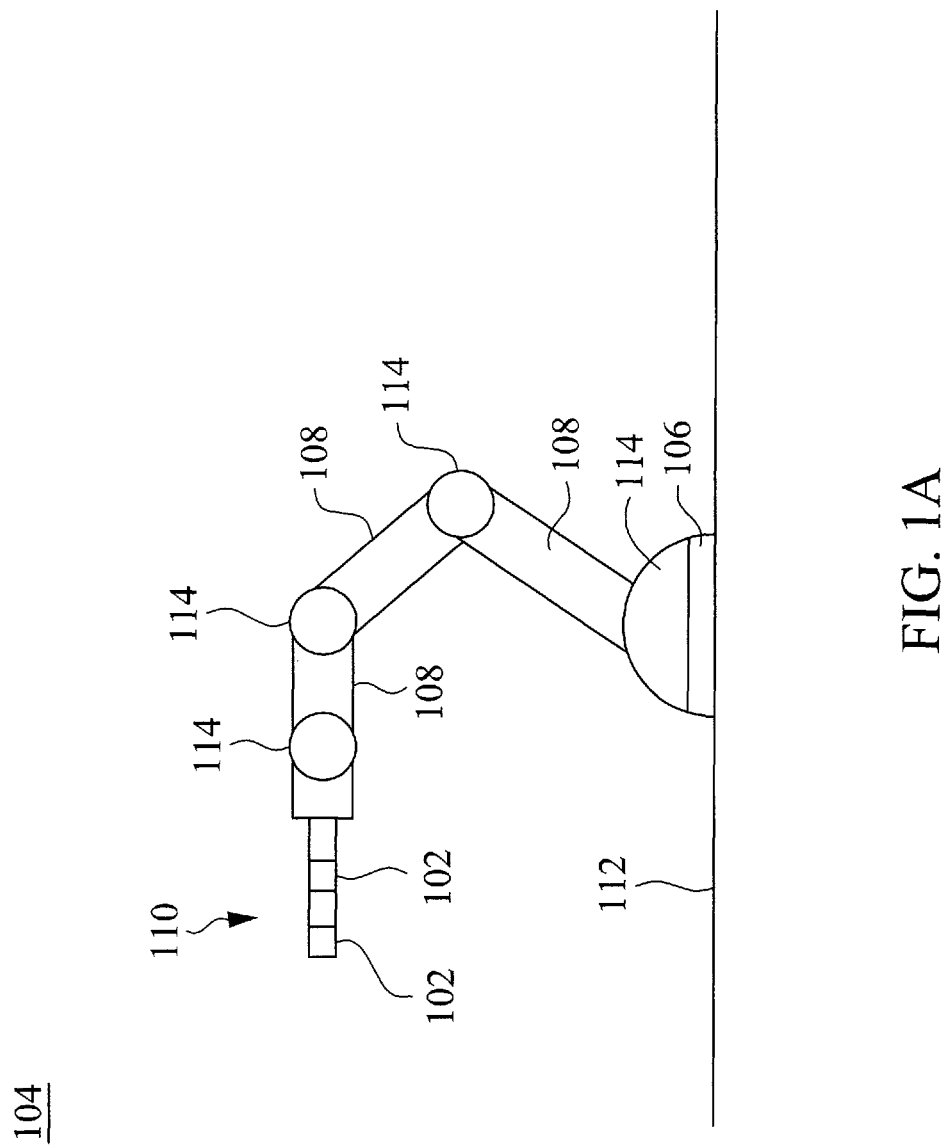
FIG. 1A is a schematic diagram of a gripper hand sensor on a robotic arm, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of gripper hand sensing for a robotic arm during semiconductor workpiece processing. A robotic arm may be a programmable mechanical arm to grasp, hold, and manipulate objects (e.g., payloads) such as a wafer. The links of a robotic arm may be connected by joints allowing either rotational motion (such as in an articulated robot) or translational (linear) displacement. The links of the robotic arm may form a kinematic chain. The terminus of the kinematic chain robotic arm may be a gripper hand. The gripper hand may be any type of end effector used for grasping or holding an object, such as a wafer, by a robotic arm.

A sensor for the robotic arm may be configured to collect sensor data from around the gripper hand. For example, a sensor may be mounted on or in the gripper hand to collect sensor data from the perspective of the gripper hand. A robotic arm may execute an automated routine as part of a semiconductor assembly line process. For example, the robotic arm may be configured to execute an automated robotic arm routine to move wafers in an automated fashion to and from semiconductor processing chambers, airlocks, load ports, or components of a workstation that includes the robotic arm. Accordingly, as the gripper hand is operated, sensor data may be collected from the perspective of the gripper hand to ascertain whether an adverse condition is present so as to modify (e.g., stop) a robotic arm routine and/or perform remediation of a semiconductor assembly line process (e.g., a transfer flow process, as discussed below). An adverse condition may be any condition for which it may be desirable to stop or modify a robotic arm routine. For example, an adverse condition may be a prediction an imminent collision of a gripper hand with an object, such as a wall of a semiconductor processing chamber or another robotic arm. This adverse condition may be determined from sensor data collected from around the gripper hand (e.g., gripper hand sensor data, also termed more simply as sensor data) that indicates that the gripper hand has moved to less than a minimum distance to the surface. Accordingly, upon determination of an adverse condition based on gripper hand sensor data, an automated robotic arm routine that would otherwise have caused a collision of the gripper hand may be stopped and/or modified to avoid the adverse condition.

Furthermore, gripper hand sensors (e.g., sensors that collect sensor data from around the gripper hand) may assess an environment that the gripper hand interacts with over time by collecting sensor data from each iteration of an automated robotic arm routine. For example, the gripper hand sensor may collect temperature data on a semiconductor processing chamber that the gripper hand places wafers into or retrieves wafers from. As another example, the gripper hand sensor may collect weight data from the various wafers that the gripper hand may handle. Accordingly, by analyzing the aggregated data from various iterations of a robotic arm routine, an adverse condition may be determined based on detection of an outlier from the aggregated data. In certain embodiments, these outliers may determine threshold values, which when passed, may define an adverse condition. These outliers may be determined in accordance with statistical analysis for outliers. For example, these outliers may define threshold values for a wafer that is too heavy or too light, which may be indicative of a wafer that is broken or improperly grasped or held. As another example, these outliers may define threshold values for a semiconductor processing chamber that is too hot or too cold (which may be indicative of a semiconductor processing chamber that may be malfunctioning).

Additionally, in certain embodiments the gripper hand sensors may be part of a pressurized workstation with a pressurized region that operates at a consistent atmospheric pressure to transport wafers between various semiconductor processing chambers in the performance of semiconductor processing. The term pressurized may refer to a level of pressure that is controlled to any level at or above a pure vacuum environment. The semiconductor processing chambers may be part of same or different tools. These semiconductor processing chambers may be part of any tool that may be utilized in the processing of wafers, such as physical vapor deposition (PVD) tools, chemical vapor deposition (CVD) tools, chemical mechanical planarization (CMP) tools, diffusion (DIF) tools, wet etching tools, dry etching tools, photolithography tools (e.g., G-line, H-line, and/or I-line tools), deep ultraviolet (DUV) tools, after developed inspection (ADI) tools, after etched inspection (AEI) tools, critical dimension (CD) inspection tools, scanning electron microscopes (SEM) tools, critical dimension scanning electron microscope (CD-SEM) tools, overlay (OVL) tools, medium current implantation (MCI) tools, high current implantation (HCI) tools, wet cleaning tools, dry cleaning tool, plasma aching (PR asher) tools, and scatterometry critical dimension (SCD) tools, and the like. However, as discussed further below, the gripper hand sensor may move among each tool in the workstation to accumulate sensor data that characterizes conditions among the various chambers and/or around the gripper hand sensor.

The workstation may have at least one airlock with which to interface with an environment differently pressurized than a pressurized region at a consistent atmospheric pressure of the workstation. For example, the workstation may interface with an external environment which may be at a different atmospheric pressure than the consistent atmospheric pressure of the workstation. In certain embodiments, the workstation may have regions of different atmospheric pressure, as outlined by respective airlocks, or may include pressurized and unpressurized regions. As introduced above, a gripper hand may be utilized as a material handling system to transport wafers among semiconductor processing chambers within a same or different tools within the workstation at, or not at, a consistent atmospheric pressure of the workstation. Also, the gripper hand may feature a gripper hand sensor that characterizes the environment within the workstation at, or not at, a region with consistent atmospheric pressure.

An airlock may include an intermediate zone between two doors (e.g., portals). One of the doors may be between the intermediate zone and the outside of a pressurized region of a workstation, and be termed as an external door. The other door may be between the intermediate zone and the pressurized region of the workstation, and be termed as an internal door. The intermediate zone may be utilized to equalize atmospheric pressure when transitioning a wafer to and from the pressurized region of the workstation. This transition may be facilitated by placing the wafer within the intermediate zone. Both the external and internal doors may be closed while the intermediate zone is sealed, pending a change of atmospheric pressure in the intermediate zone. Then either the external or the internal door may be opened based on whether the atmospheric pressures is changed to the consistent atmospheric pressure of the pressurized region of the workstation (to open the internal door) or an external atmospheric pressure outside of the pressurized region of the workstation (to open the external door). In certain embodiments, after opening the internal door, the internal door may remain open until a wafer is to be transferred out of the pressurized region of the workstation. By keeping the internal door open, overhead (e.g., power consumption) may be reduced as the internal door need not be reopened each time a wafer is to be transferred out of the pressurized region of the workstation. For example, the internal door may be open and the external door may be closed when the intermediate zone is at the consistent atmospheric pressure of the pressurized region of the workstation. Also, the intermediate zone may not be open to the pressurized region of the workstation when the intermediate zone is not at the consistent atmospheric pressure of the pressured region of the workstation. For example, the internal door may be closed when the intermediate zone is not at the consistent atmospheric pressure of the pressurized region of the workstation.

In particular embodiments, the consistent atmospheric pressure of a pressurized region of the workstation may be less than 1 atm. In certain embodiments, the consistent atmospheric pressure of the pressurized region(s) of the workstation may be from about $10^{-1}$ Torr to about $10^{-3}$ Torr. In further embodiments, the consistent atmospheric pressure of the pressurized region(s) of the workstation may be from about 0 atm to less than 1 atm. In various embodiment, the lower the atmospheric pressure of the workstation, the lower the particle count in the workstation (e.g., fewer particles per given volume of space, and fewer particles that may undesirably deposit on a wafer during semiconductor processing). In yet further embodiments, the consistent atmospheric pressure of the pressurized region(s) of the workstation may be at a set level above 1 atm.

FIG. 1A is a schematic diagram of a gripper hand sensor 102 on a robotic atm 104, in accordance with some embodiments. As introduced above, the robotic arm 104 may be a programmable mechanical arm to grasp, hold, and manipulate objects. The robotic arm 104 may include a base 106, at least one link 108, and the gripper hand 110. The gripper hand 110 may be any type of end effector used for grasping or holding an object, such as a wafer, by the robotic arm 104. The gripper hand may utilize any type of gripping mechanism to manipulate an object, such as a wafer. For example, the gripping mechanism may be a pressure gripper (e.g., gripping by applying pressure to an object, such as with a pincer type motion), an area gripper (e.g., gripping by surrounding an object to be manipulated), a vacuum gripper (e.g., gripping by suction force), and a magnetic gripper (e.g., gripping by use of electromagnetic forces). In certain embodiments, the gripper hand may utilize at least two fingers, with one opposing the other. The multiple fingers may be utilized to apply pressure as a pressure gripper and or as an envelope gripper.

The base 106 may be a secured point at a terminus of the robotic arm. The base may be utilized to stabilize the robotic arm. For example, the base 106 may be a part of the robotic arm that interacts with, and secures the robotic arm relative to, a surface 112 on which the robotic arm rests. The surface 112 may be the ground or a platform on which various semiconductor processing devices, such as semiconductor processing chambers, may rest. In certain embodiments, the base 106 may be secured via screws or other mechanical adhesives that adheres the base to the surface 112.

The at least one link 108 of the robotic arm may be at least one piece that connects the gripper hand 110 with the secured base 106. The at least one link may be interconnected by joints 114 allowing either rotational motion (such as in an articulated robot) or translational (linear) displacement. Accordingly, the at least one link 108 of a robotic arm may form a kinematic chain with terminuses at the gripper hand 110 or the base 106. For example, the robotic arm 104 may include a single link with two joints between the link and the gripper hand 110 and the base 106 or may include multiple links (e.g., two links 108) with respective joints 114 between the links. The joints 114 may be powered by a variety of means, including electric motors. The joints may provide the robotic arm with degrees of freedom, or an amount of independent motions in which the gripper hand may be moved.

A gripper hand sensor 102 may be a sensor mounted on, or within, the gripper hand 110. Also, there may be one or more gripper hand sensors 110 in certain embodiments. The gripper hand sensor 102 may collect sensor data from the perspective of the gripper hand 110. This sensor data may be utilized to characterize an environment that the gripper hand 110 is exposed to, such as the surroundings of the gripper hand 110, an object gripped by the gripper hand 110 or a surface that touches the gripper hand 110. As will be discussed further below, this sensor data may be utilized in the performance of a gripper hand sensor process, which may determine whether an adverse condition is present. The gripper hand sensor may be any type of sensor utilized to collect sensor data. For example, the gripper hand sensor may be at least one of a radar monitor (e.g., a frequency modulated continuous wave (FMCW) radar monitor), an image sensor (e.g., a charge coupled device (CCD) image sensor), a weight sensor (e.g., a weight sensor), an electronic nose sensor (e.g., a gas molecule detector), an infrared range finder, and/or an infrared thermometer. In certain embodiments, it may be desirable to utilize gripper hand sensors that are as small as practical, such as to not add unnecessary bulk to the gripper hand that may interfere with the operations of the gripper hand.

In various embodiments, different types of gripper hand sensors may collect different types of sensor data for different uses. For example, a radar monitor sensor may collect frequency modulated continuous wave (FMCW) sensor data that can be utilized to determine a spatial relationship, velocity, speed, or rate of movement as well as distances to objects. An image sensor may collect image data that can be utilized to characterize an image or a video of the surroundings of the gripper hand, for purposes such as to determine whether a semiconductor processing chamber has any abnormality. A weight sensor may collect real time weight sensor data that characterizes a wafer weight, for purposes such as to determine wafer chipping or breakages. An electronic nose sensor may collect gas molecule sensor data (e.g., the presence of particular gas molecules), for purposes such as to determine whether there are an abnormal concentrations of gas molecules around the gripper hand (e.g., within a semiconductor processing chamber). For example, the electronic nose sensor may collect gas molecule sensor data to determine whether wafer outgassing has occurred during semiconductor processing. A range finder, such as an infrared range finder may collect infrared range data on distances to a surface (e.g., distance form a gripper hand to a surface of the semiconductor processing chamber), for purposes such as to control robot arm leveling. A thermometer, such as an infrared thermometer, may be utilized to determine the temperature at the gripper hand and/or within a semiconductor processing chamber that the gripper hand may interact with.

In addition, various sensor tools that may facilitate the gathering of sensor data may also be collocated, or proximal to the gripper hand sensor. For example, a light source, such as a micro laser emitting diode (LED) light, may be a sensor tool for an image sensor to illuminate an area from which sensor data is collected. Accordingly, the sensor tool may be configured to work in conjunction with the respective sensor, such as a light source providing illumination (e.g., a flash) when the image sensor is collecting image data. As another example of a sensor tool, a gas nozzle and/or a vacuum tip may be utilized to facilitate detection of gas molecules by the electronic nose sensor. For example, the vacuum tip may be utilized to vacuum or bring gas molecules toward the electronic noise sensor and the gas nozzle may be utilized to eject gas molecules away from the electronic nose sensor.

Although FIG. 1 illustrates a robotic arm 104 with only a single base 106 and a single gripper hand 110, a robotic arm may have any number of bases and/or gripper hands as desired for different applications in accordance with various embodiments. For example, a robotic arm may have a single base and two or more gripper hands.

Figure 1B:
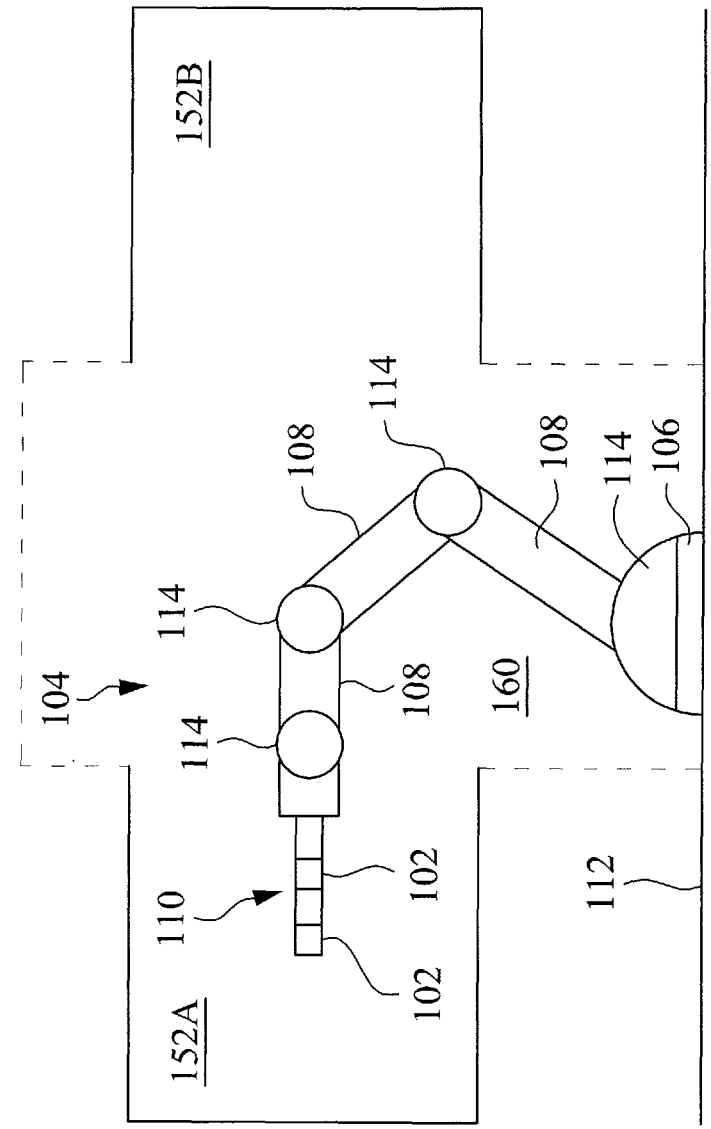
FIG. 1B is a schematic diagram of a gripper hand sensor on a robotic arm that may move between different semiconductor processing chambers, in accordance with some embodiments.

FIG. 1B is a block diagram of the gripper hand sensor 102 on a robotic arm 104 that may move between different semiconductor processing chambers 152A, 152B, in accordance with some embodiments. As introduced above, these semiconductor processing chambers 152A, 152B may be semiconductor processing chambers that may be part of a same or different tools. The robotic arm 104 may move the gripper hand sensor 102 between the semiconductor processing chambers 152A, 152B. This movement may be in lieu of or during the course of also moving a wafer. Also, the entirety of the semiconductor processing chambers 152A, 152B and the robotic arm 104 with gripper hand sensor 102 may be within a pressurized region 160 of a workstation (e.g., within a pressurized atmosphere of a workstation). Stated another way, the workstation may include the pressurized region 160 with an environment at a consistent atmospheric pressure for which wafers may be transported. For example, the wafers may be transported between various semiconductor processing chambers 152A, 152B in the performance of semiconductor processing. Also, in the course of being transported, sensor data characterizing the regions traversed by the gripper hand sensor 102 mounted on the robotic arm 104 may be aggregated and analyzed.

FIG. 1C is a cross sectional view of a robotic arm 170 reaching into a semiconductor processing chamber 174, in accordance with some embodiments. The robotic arm 170 may include a gripper hand sensor 176. The semiconductor processing chamber 174 may be enclosed via a door 178 (e.g., a portal) which may be selectively opened to allow the robotic arm 170 to extend into the semiconductor processing chamber 174. Also, the semiconductor processing chamber 174 may be relatively narrow, allowing for little clearance above and below an extended robotic arm 170 within the semiconductor processing chamber 174. Also, no sensor may have access to characterize the environment within the semiconductor processing chamber 174 aside from the gripper hand sensor 176 when robotic arm 170 extends within the semiconductor processing chamber 174.

Figure 2:
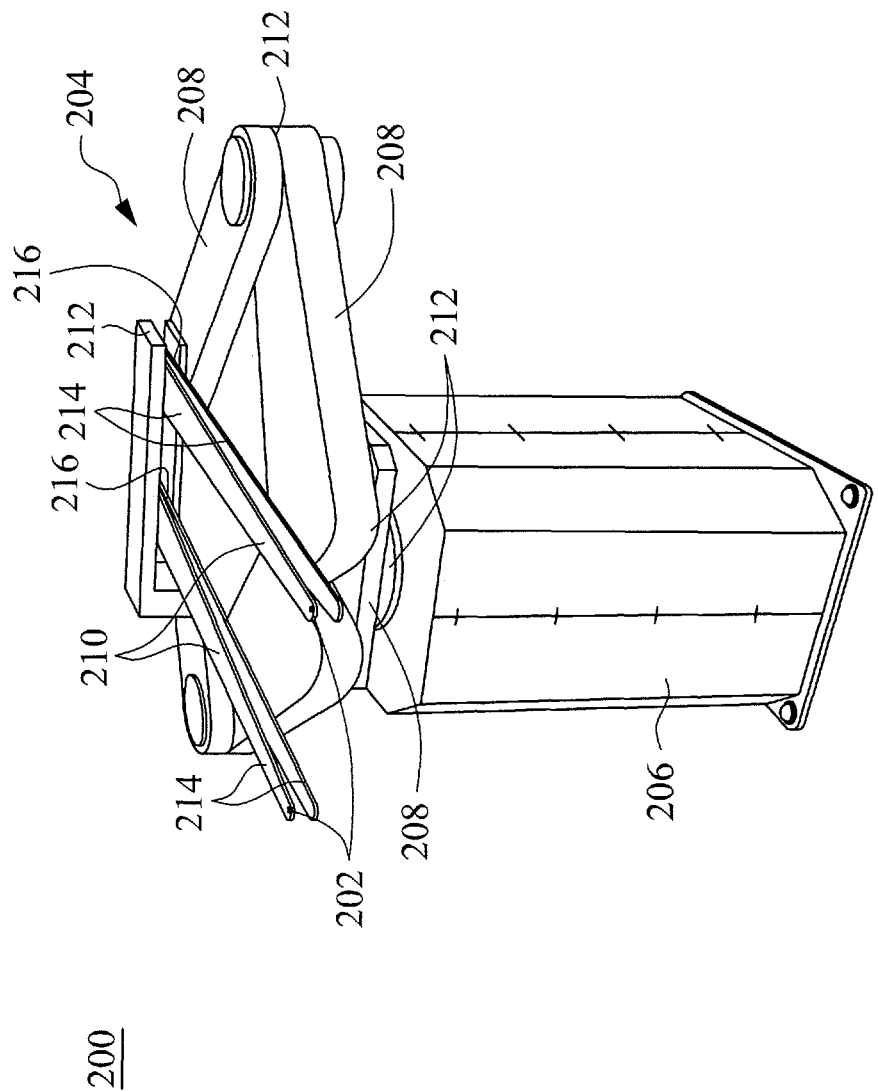
FIG. 2 is an illustration of a gripper hand sensor on a robotic arm, in accordance with some embodiments.

FIG. 2 is an illustration of a gripper hand sensor 202 on a robotic arm 204, in accordance with some embodiments. The robotic arm 204 may include a base 206, at least one link 208, and the gripper hand 210. The base 206, at least one link 208, and the gripper hand 210 may be interconnected via respective joints 212. Furthermore, each of the links 208 of the at least one link 208 may be also connected via respective joints 212. As noted above, the joints 212 may provide the robotic arm with degrees of freedom, or an amount of independent motions in which the gripper hand may be moved.

The gripper hand 210 may include at least two sets of opposed fingers 214. The set of opposed fingers 214 may act as a pressure gripper in a pincer type motion that slides into a wafer and then applies pressure to grasp the wafer so that the wafer is immobile while the gripper hand 210 is in motion. Each set of opposed fingers 214 may be opened or closed by a gripper hand joint 216 between the two fingers 214, that facilitates the movement of the gripper's fingers 214.

The links 208 and associated joints 212 may be configured to provide a rotational and/or lateral movement to the gripper hand 210. For example, each of the joints 212 may be configured to rotate and provide either rotation around an axis of rotation for the gripper hand 210 and/or lateral motion of the gripper hand such that the gripper hand 210 may be part of reaching and retraction motions.

The gripper hand sensor 202 may be any type of sensor configured for collection of sensor data as introduced above. It may be desirable for the gripper hand sensor to occupy as small a footprint as practical on the gripper hand 210 so as not to interfere with the operation of the gripper hand 210, or be damaged during operation of the gripper hand 210. The gripper hand sensor 202 may be any type of sensor, such as at least one of the sensors as discussed above. Although a single gripper hand sensor 202 is illustrated as being located on a finger 214 of a set of opposed fingers 214, gripper hand sensors 202 may be located in any location or in any number as desired for different applications in accordance with various embodiments. For example, the gripper hand sensor 202 may be embedded within the gripper hand 210 as opposed to being located on the gripper hand 210. Also, only one gripper hand sensor 202 may be utilized for only one of the multiple sets of opposed fingers 214. Furthermore, multiple gripper hand sensors 202 may be placed in a same place (e.g., as an integrated sensor with multiple sensor functionalities) or may be placed in different places (e.g., on opposite fingers 214 of a set of opposed fingers 214). Additionally, in certain embodiments, a gripper hand may have an articulated digit where parts of the articulated digit are connected by at least one gripper hand joint and a sensor is mounted on one of the parts of the articulated digit or with a gripper hand joint.

Figure 3A:
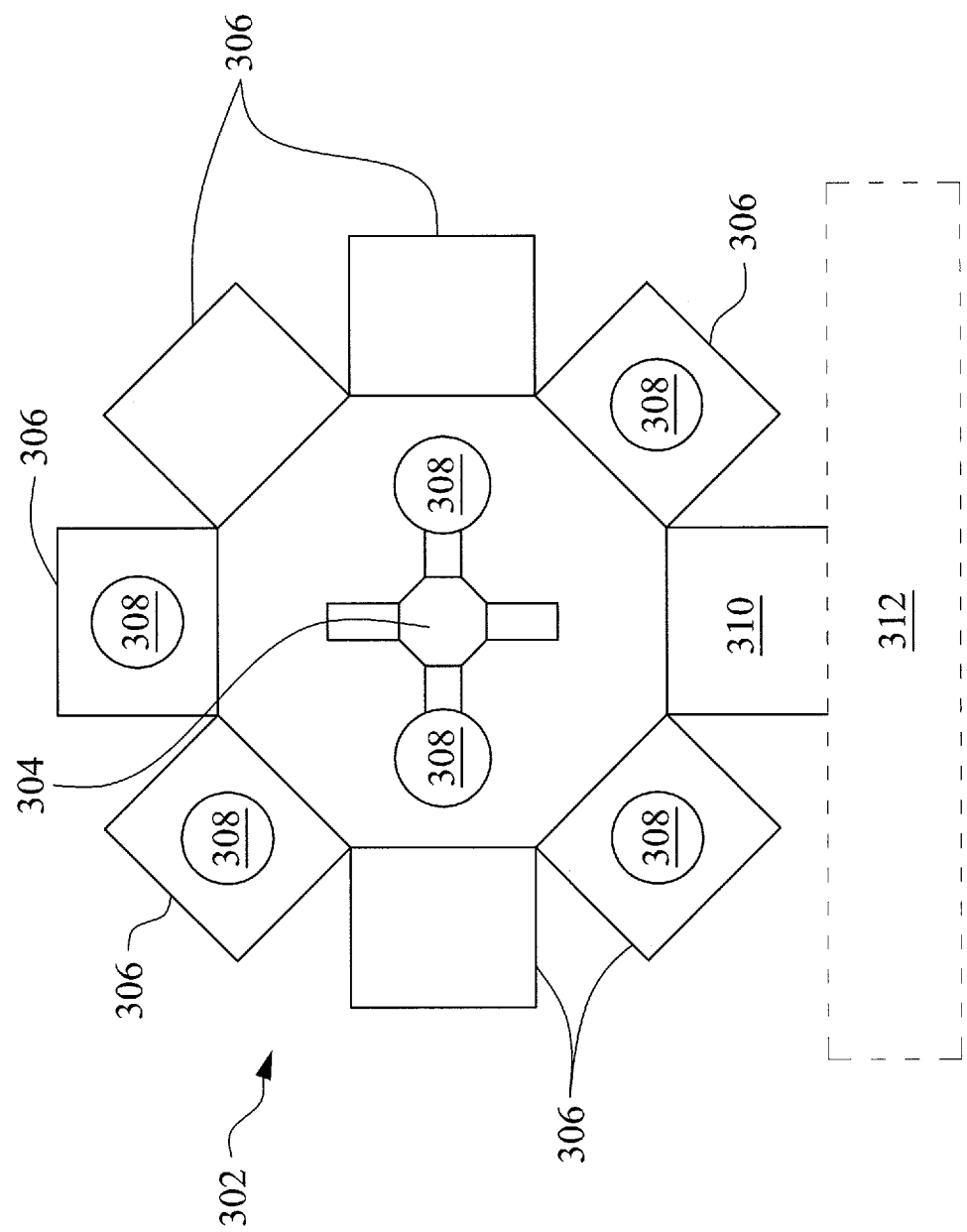
FIG. 3A is a schematic diagram of a workstation in which a robotic arm may function, in accordance with some embodiments.

FIG. 3A is a schematic diagram that illustrates a workstation 302 in which a robotic arm 304 may function, in accordance with some embodiments. The workstation 302 may include multiple semiconductor processing chambers 306, each configured to receive a wafer 308 for semiconductor processing. Certain of the semiconductor processing chambers 306 may not include a wafer 308 while others may include a wafer 308 at a point in time. The workstation 302 may also include an airlock 310 that interfaces with an automated material handling system 312 that may bring wafers 308 into and out of the airlock 310. The workstation 302 may include the robotic arm 304 configured to transfer wafers among the semiconductor processing chambers 306 and the airlock 310. The robotic arm 304 may include a gripper hand sensor configured for collection of sensor data as introduced above The semiconductor processing chambers 306 may include any semiconductor processing chamber for receipt and processing of a wafer or other semiconductor workpiece. Example processes that may be performed in these semiconductor processing chambers include processes related to physical vapor deposition (PVD), chemical vapor deposition (CVD), chemical mechanical planarization (CMP), diffusion (DIF), wet etching, dry etching, photolithography, after developed inspection (ADI), after etched inspection (AEI), critical dimension (CD) inspection, scanning electron microscope (SEM) inspection, critical dimension scanning electron microscope (CD-SEM) inspection, wet cleaning, dry cleaning, and plasma etching.

Figure 3B:
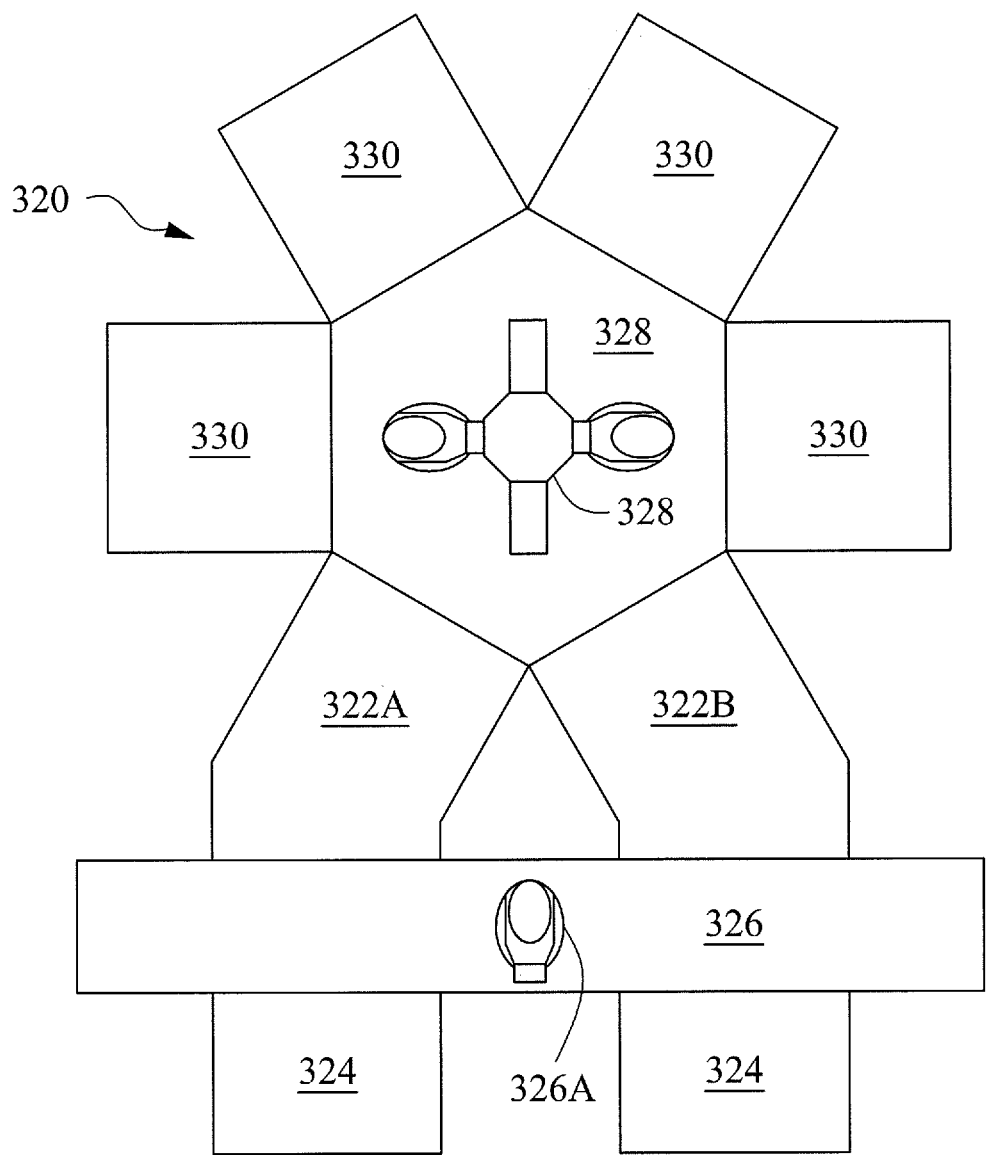
FIG. 3B is a schematic diagram of a workstation with an input and an output airlocks, in accordance with some embodiments.

FIG. 3B is a schematic diagram of a workstation 320 with an input airlock 322A and an output airlock 322B, in accordance with some embodiments. The workstation 320 may include load ports 324, interface modules 326, airlocks 322A, 322B, a transfer module 328, and various semiconductor processing chambers 330. The load port 324 may be an external interface with systems outside of the workstation 320. For example, wafers or wafer pods (e.g., a set of wafers, such as wafers within a front opening unified pod (FOUP)) may be deposited on the load port 324. The interface module 326 may include a robotic arm 326A configured to transfer wafers among the load ports 324 and the airlocks 322A, 322B. The robotic arm 326A may be movable and/or extendable between the various load ports 324 and the airlocks 322A, 322B sufficient to manipulate a wafer within the load ports 324 and the airlocks 322A, 322B. The robotic arm 326A may include a gripper hand sensor configured for collection of sensor data as introduced above. In other embodiments, the interface module 326 may have multiple robots, such as a robot between the input airlock 322A and a closest load port 324 and another robot between the output airlock 322B and a closest load port 324.

The airlocks 322A, 322B may define a boundary between a pressurized region of the workstation 320 and an unpressurized region of the workstation 320. The specifics of airlock operation (e.g., how the intermediate zone of an airlock may transition between differently pressurized environments) is discussed in detail above and will not be repeated here for brevity. Accordingly, the transfer module 328 and the semiconductor processing chambers 330 may be within the pressurized region of the workstation 320 (e.g., a region of the workstation controlled to be pressurized below a standard atmosphere, or from a vacuum to less than 1 atm). Also, the load ports 324 and the interface module 326 may be within a non-pressurized region of the workstation 320 (e.g., a region of the workstation not specifically controlled to be within a particular pressure level).

As introduced above, the transfer module 328 may include a robotic arm 328A that may transport a wafer between and/or among the semiconductor processing chambers 330 and the airlock 322A, 322B. The robotic arm 328A may include a gripper hand sensor configured for collection of sensor data as introduced above. Also, the input airlock 322A may be configured, or used for, wafers en route to processing by the semiconductor processing chambers 330. The output airlock 322B may be configured, or used for, wafers after processing by the semiconductor processing chambers 330.

Figure 3C:
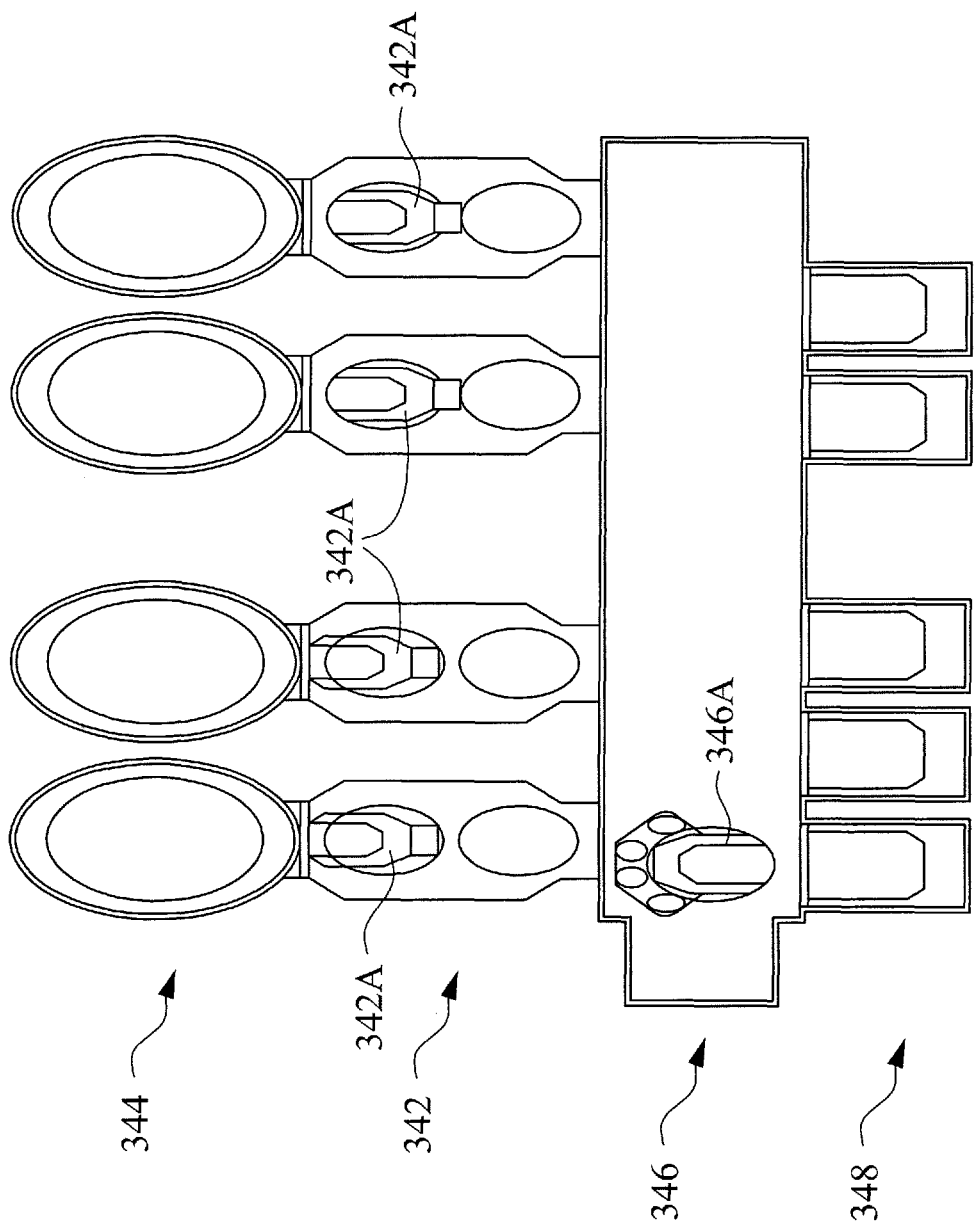
FIG. 3C is a schematic diagram of a workstation with individual airlocks for each semiconductor processing chamber, in accordance with some embodiments.

FIG. 3C is a schematic diagram of a workstation 340 with individual airlocks 342 for each semiconductor processing chamber 344, in accordance with some embodiments. The workstation 340 may include four semiconductor processing chambers 344, which are each interfaced with an individual airlock 342. Each airlock 342 may have a robotic arm 342A with which to move a wafer between a respective semiconductor processing chamber 344 and airlock 342 and/or an interface module 346. Each robotic arm 342A may include a gripper hand sensor configured for collection of sensor data as introduced above. Each of the four semiconductor processing chambers 344 may be maintained at a same, or different, atmospheric pressure (e.g., less than 1 atm). However, the interface module 346 and the load ports 348 may not be at a particular controlled atmospheric pressure. The interface module 346 may include a robotic arm 346A which may move within the interface module 346 and transfer wafers among various airlocks 342 and load ports 348. The robotic arm 346A may include a gripper hand sensor configured for collection of sensor data as introduced above. By having a robotic arm within the airlock, a separate transfer module may not be necessary as the robotic arm 342A within the airlock may directly transfer a wafer between a semiconductor processing chamber 344 and the airlock 342 and/or the interface module 370.

Figure 3D:
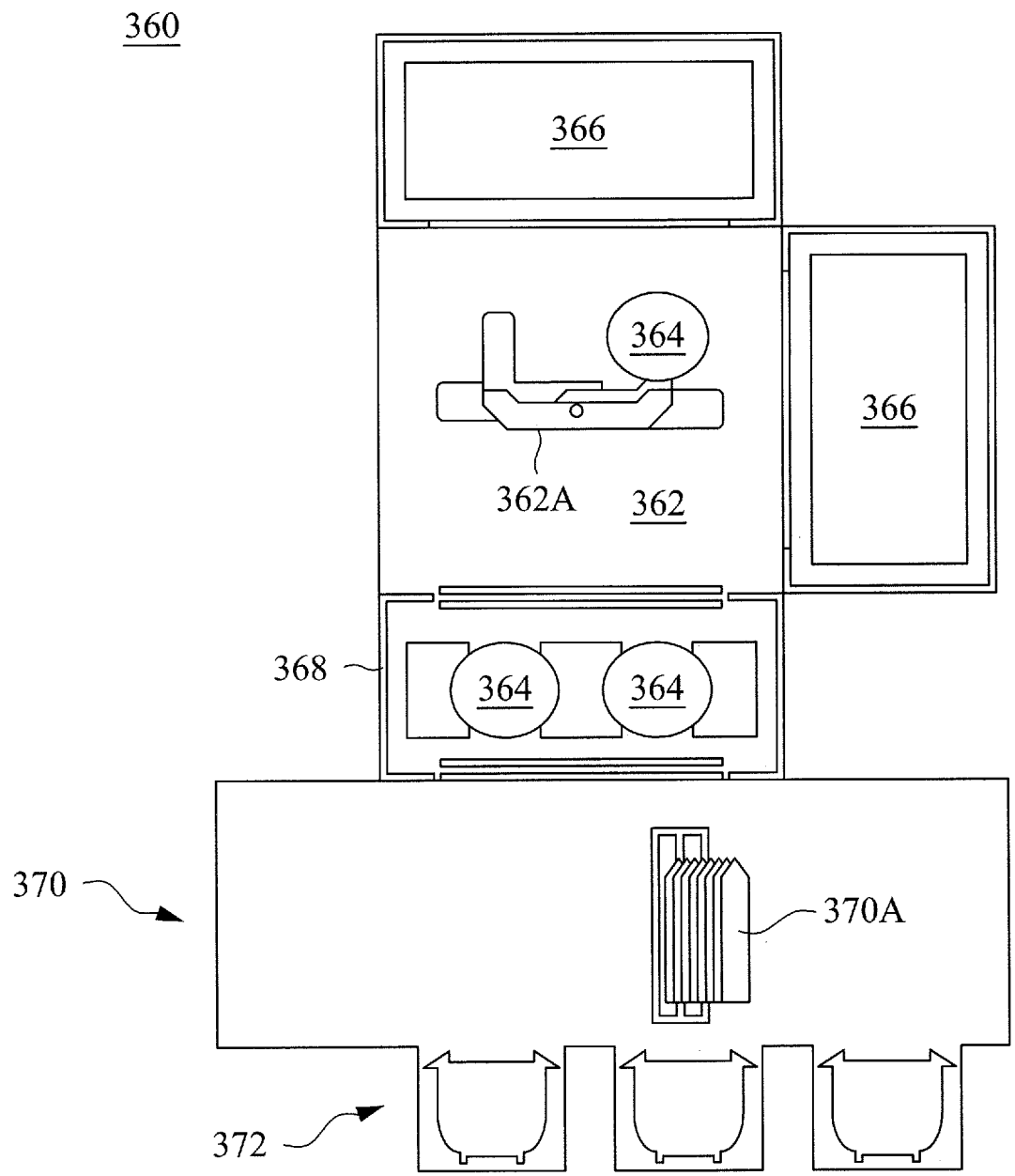
FIG. 3D is a schematic diagram of a workstation with a robotic arm that may transport multiple wafers at a time, in accordance with some embodiments.

FIG. 3D is a schematic diagram of a workstation 360 with a robotic arm 362A that may transport multiple wafers 364 at a time, in accordance with some embodiments. The robotic arm 362A may be part of a transfer module 362 and may be configured for transport of one or more wafers for processing at semiconductor processing chambers 366. The robotic arm 362A may also be configured to transport wafers 364 between the semiconductor processing chamber(s) 366 and an airlock 368. The robotic arm 362A may also include a gripper hand sensor configured for collection of sensor data as introduced above. Furthermore, an interface module 370 may have a robotic arm 372A that may transport wafers(s) between the airlock 368 and respective load ports 372. The robotic arm 370A may also include a gripper hand sensor configured for collection of sensor data as introduced above. Accordingly, the semiconductor processing chambers 366 and the transfer module 362 may be maintained at a consistent atmospheric pressure (e.g., less than 1 atm). However, the interface module 370 and the load ports 372 may not be at the consistent atmospheric pressure.

Figure 4:
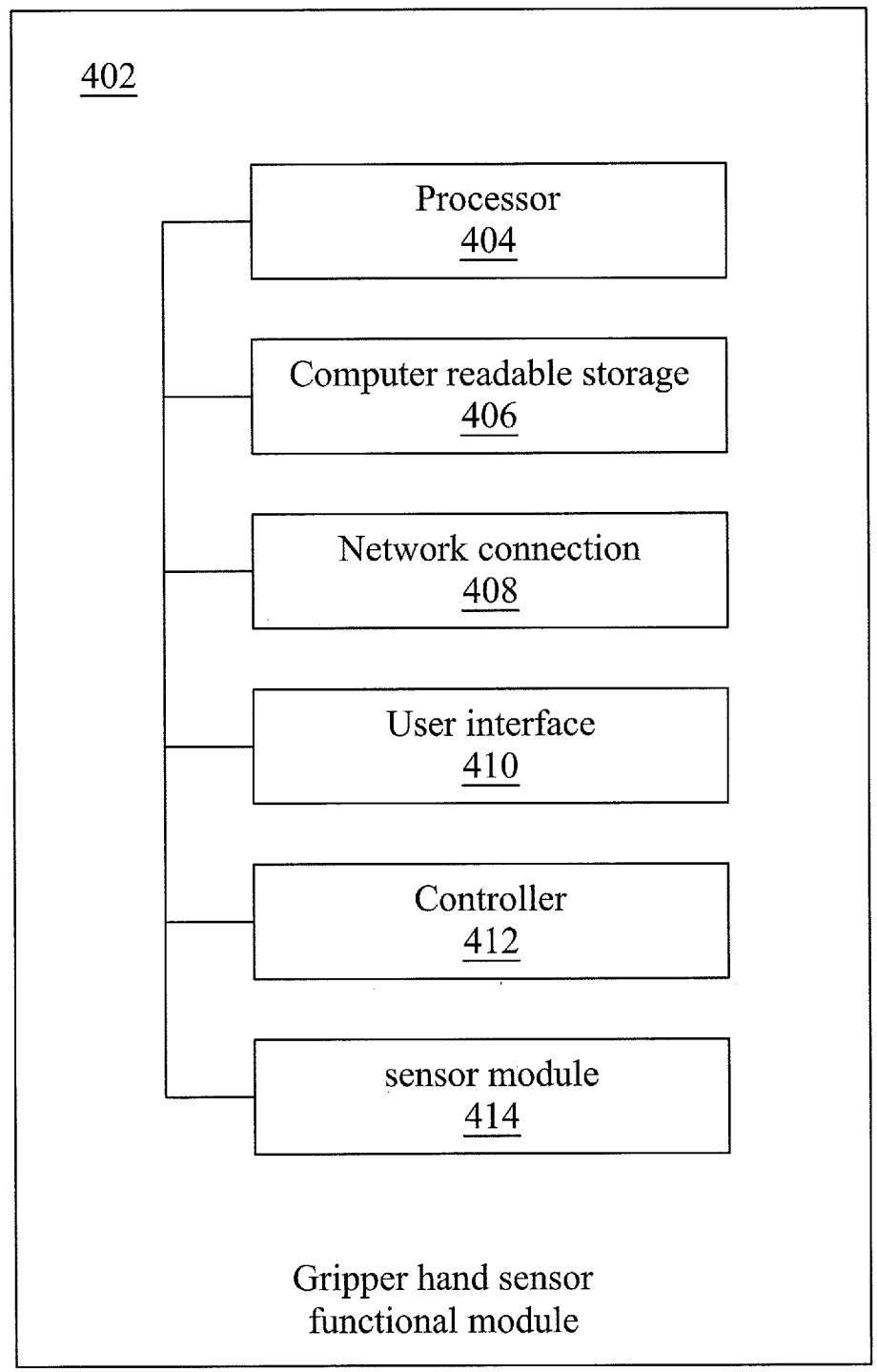
FIG. 4 is a block diagram of various functional modules of a gripper hand sensor functional module, in accordance with some embodiment.

FIG. 4 is a block diagram of various functional modules of a gripper hand sensor functional module 402, in accordance with some embodiment. The gripper hand sensor functional module 402 may be part of a workstation that includes at least one robotic arm with a gripper hand sensor. The gripper hand sensor functional module 402 may include a processor 404. In further embodiments, the processor 404 may be implemented as one or more processors.

The processor 404 may be operatively connected to a computer readable storage module 406 (e.g., a memory and/or data store), a network connection module 408, a user interface module 410, a controller module 412, and a sensor module 414. In some embodiments, the computer readable storage module 406 may include gripper hand sensor process logic that may configure the processor 404 to perform the various processes discussed herein. The computer readable storage may also store data, such as sensor data collected by the sensors, data for identifying an adverse condition, identifiers for a wafer, identifiers for a robotic arm, identifiers for a gripper hand, identifiers for a sensor, and any other parameter or information that may be utilized to perform the various processes discussed herein.

The network connection module 408 may facilitate a network connection of the workstation with various devices and/or components of the workstation that may communicate within or external to the gripper hand sensor functional module 402. In certain embodiments, the network connection module 408 may facilitate a physical connection, such as a line or a bus. In other embodiments, the network connection module 408 may facilitate a wireless connection, such as over a wireless local area network (WLAN) by using a transmitter, receiver, and/or transceiver. For example, the network connection module 408 may facilitate a wireless or wired connection with various gripper hand sensors, the processor 404 and the controller module 412.

The gripper hand sensor functional module 402 may also include the user interface module 410. The user interface may include any type of interface for input and/or output to an operator of the workstation, including, but not limited to, a monitor, a laptop computer, a tablet, or a mobile device, etc.

The gripper hand sensor functional module 402 may include a controller module 412. In certain embodiments, the controller module may be implemented by (e.g., as part of) the processor 404. The controller module 412 may be configured to control various physical apparatuses that control movement or functionality of the workstation, robotic arm and/or components of the robotic arm. For example, the controller module 412 may be configured to control movement or functionality for at least one of a door, an airlock, a semiconductor processing chamber, link, the gripper hand, fingers, a gripper hand sensor, a sensor tool and/or joints. For example, the controller module 412 may control a motor that may move at least one of a door, joint, a finger, a gripper hand, a sensor, a sensor tool, and/or a link of a robotic arm. The controller may be controlled by the processor and may carry out the various aspects of the various processes discussed herein.

Figure 5:
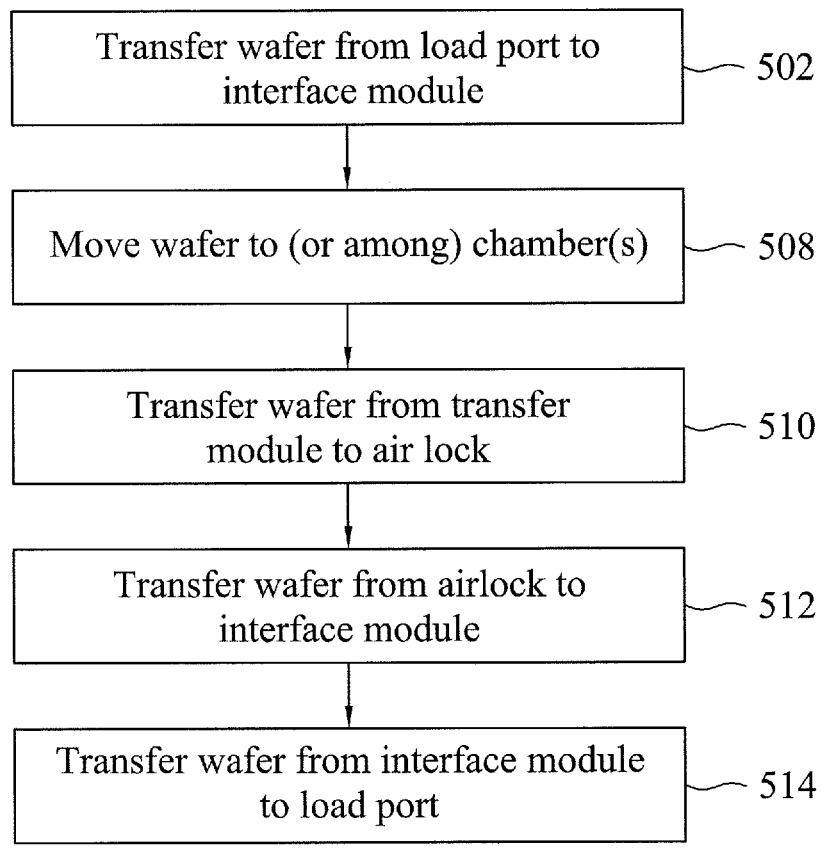
FIG. 5 is a flowchart of a transfer flow process into a controlled environment, in accordance with some embodiments.

FIG. 5 is a flowchart of a transfer flow process 500 with a controlled environment, in accordance with some embodiments. The transfer flow process may be performed by a workstation, as introduced above. It is noted that the process 500 is merely an example, and is not intended to limit the present disclosure. Accordingly, it is understood that additional operations may be provided before, during, and after the process 500 of FIG. 5, certain operations may be omitted, certain operations may be performed concurrently with other operations, and that some other operations may only be briefly described herein. Specific details of how a gripper hand sensor may function within the context of the transfer flow process will be discussed in further detail in connection with FIG. 6.

At operation 502, a wafer may be transferred from a load port to an interface module. For example, in certain embodiments, a robotic arm at the interface module may reach into a load port to handle the wafer. The robotic arm at the interface module may also include a gripper hand sensor configured for collection of sensor data. In certain embodiments, the collection of sensor data may be in the context of a gripper hand sensor process, as discussed further below.

At operation 504, the wafer may be transferred from the interface module to an airlock. A robotic arm of the interface module may transfer the wafer to the airlock (e.g., release the wafer within the airlock), and then retract back into the interface module.

At operation 506, the wafer may be transferred from the airlock to the transfer module using a robotic arm of the transfer module. The robotic arm of the transfer module may also include a gripper hand sensor configured for collection of sensor data as introduced above. In certain embodiments, the collection of sensor data may be in the context of a gripper hand sensor process, as discussed further below. Also, as noted above, an airlock may define a separation between areas of a workstation of different atmospheric pressure. An internal door may open to allow a wafer to be transported by a robotic arm of the transfer module when the atmospheric pressure within the intermediate zone of the airlock is equalized with the atmospheric pressure of the transfer module. Also, external door may open to allow a wafer to be transported by a robotic arm of the interface module when the atmospheric pressure within the intermediate zone of the airlock is equalized with the atmospheric pressure of the interface module.

At operation 508, the wafer may be moved to or among one or more semiconductor processing chambers. In certain embodiments, a workstation may feature multiple same semiconductor processing chambers, which may process multiple wafers in parallel (e.g., respectively at a same time). In other embodiments, a workstation may feature multiple different semiconductor processing chambers which may process a wafer serially (e.g., respectively, one after another as processed by different tools). Accordingly, a robotic arm of a transfer module may transfer a wafer among different semiconductor processing chambers and/or to and from semiconductor processing chambers and airlocks.

At operation 510, the wafer, after processing by respective semiconductor processing chamber(s), may be transferred from the transfer module to the airlock. This may be a reverse process of operation 506 and performed by the robotic arm of the transfer module.

At operation 512, the wafer may be transferred from the airlock to the interface module. This may be a reverse process of operation 504 and performed by the robotic arm of the interface module.

At operation 514, the wafer may be transferred from the interface module back to the load port. This may be a reverse process of operation 502 and performed by the robotic arm of the interface module.

Although particular operations are discussed in connection with the transfer flow process 500, different operations may be may be utilized in the performance of a transfer flow process 500 as desired for different applications in accordance with various embodiments. For example, the transfer flow process 500 may omit a transfer module in favor of using an airlock that includes a robotic arm which may function similar to the robotic arm of the transfer module, as discussed above in connection with FIG. 3C.

Figure 6:
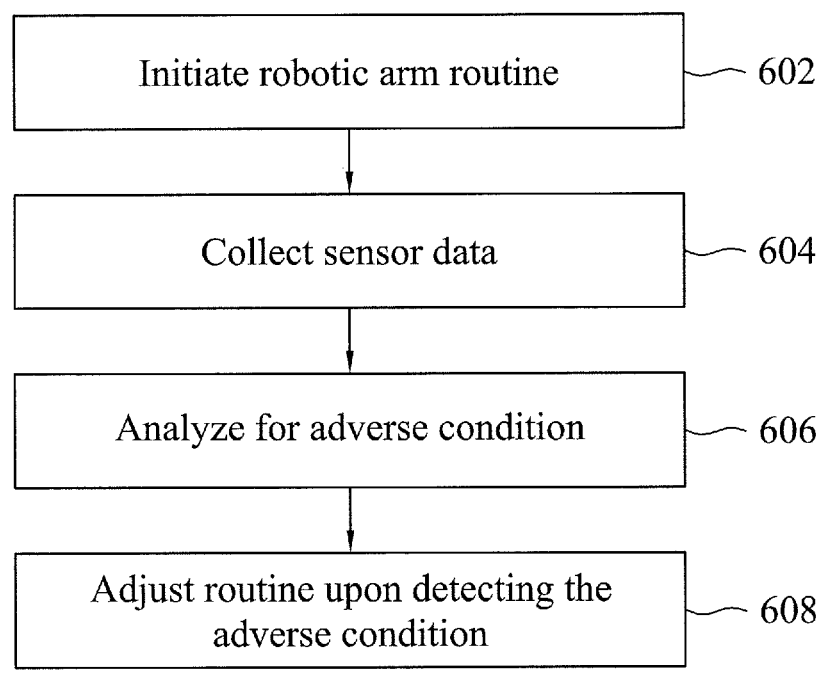
FIG. 6 is a flowchart of a gripper hand sensor process, in accordance with some embodiments.

FIG. 6 is a flowchart of a gripper hand sensor process, in accordance with some embodiments. The gripper hand sensor process may be performed by a workstation, as discussed above. It is noted that the process 600 is merely an example, and is not intended to limit the present disclosure. Accordingly, it is understood that additional operations may be provided before, during, and after the process 600 of FIG. 6, certain operations may be omitted, certain operations may be performed concurrently with other operations, and that some other operations may only be briefly described herein.

At operation 602, a robotic arm routine may be initiated at the workstation. The robotic arm routine may include any set of operations for a robotic arm. For example, a robotic arm routine may include iterations of picking a wafer up from a first location, moving the wafer to a second location, depositing the wafer at the second location for semiconductor processing (e.g., in a semiconductor processing chamber, load port, airlock, interface module, or an automated material handling system so that the wafer may be transported for further processing), retrieving the wafer from the second location after semiconductor processing, and returning the wafer to the first location (e.g., such as a semiconductor processing chamber, load port, airlock, interface module, or an automated material handling system so that the wafer may be transported for further processing). Typically, a robotic arm may perform multiple iterations of the robotic arm routine in the performance of semiconductor processing. For example, the robotic arm of a workstation may transfer multiple wafers between different locations at different times, where each wafer may be transferred in a same manner and among the same locations. Each of these locations may be locations for which wafers may be located and/or processed in the course of semiconductor processing (e.g., as a station of an assembly line or part of a workstation). In certain embodiments, the robotic arm may perform the processing, instead of being an instrument of transfer of the wafer between different chambers or stations for semiconductor processing.

At operation 602, sensor data may be collected at a gripper hand sensor of the workstation at the robotic arm performing the robotic arm routine. The collection of sensor data may occur in real time as the robotic arm routine is being performed. This sensor data may be utilized for analysis of whether an adverse condition is present. In various embodiments, the sensor data may be stored locally at the respective sensor that collected the sensor data and/or may be stored in the computer readable storage discussed above.

As introduced above, the gripper hand sensor may be any type of sensor utilized to collect sensor data. For example, a radar monitor sensor may collect frequency modulated continuous wave (FMCW) sensor data that can be utilized to determine a velocity, speed, or rate of movement as well as distances to objects. An image sensor may collect image data that can be utilized to characterize an image or a video of the surroundings of the gripper hand. A weight sensor may collect real time weight sensor data that characterizes a wafer weight. An electronic nose sensor may collect gas molecule sensor data (e.g., the presence of particular gas molecules). A range finder, such as an infrared range finder may collect infrared range data on distances to a surface (e.g., distance form a gripper hand to a surface of the chamber). A thermometer, such as an infrared thermometer, may be utilized to determine the temperature at the gripper hand.

In addition, various sensor tools that may facilitate the gathering of sensor data may also be collocated, or proximal to a respective gripper hand sensor. For example, a light source, such as a micro laser emitting diode (LED) light, may be a sensor tool for an image sensor to illuminate an area from which sensor data is collected. As another example of a sensor tool, a gas nozzle and/or a vacuum tip may be utilized to facilitate detection of gas molecules by the electronic nose sensor. For example, the vacuum tip may be utilized to vacuum or bring gas molecules (e.g., argon or nitrogen) toward the electronic nose sensor and the gas nozzle may be utilized to eject gas molecules away from the electronic nose sensor.

At operation 606, the sensor data may be analyzed by the workstation to determine whether an adverse condition has occurred. Specifically, the gripper hand sensor functional module may perform this analysis based upon the sensor data gathered by at least one gripper hand sensor. An adverse condition may be any condition for which it may be desirable to stop or modify a robotic arm routine. For example, an adverse condition may be a prediction of an imminent collision of a gripper hand with a surface, such as a wall of a chamber. This type of adverse condition may be detected by utilizing a sensor such as a range finder or a radar monitor to determine a closeness or trajectory of a gripper hand during the robotic arm routine and triggering an adverse condition when the distance of a gripper hand to a surface, such as a wall of a semiconductor processing chamber, is below a threshold value (e.g., a minimum safe distance between a gripper hand (or a gripper hand sensor) to the surface). In particular embodiments, the respective sensor data (e.g., sensor data from a range finder, radar monitor, image sensor, and the like) may be collected and analyzed by a processor or a controller module to determine whether an adverse condition has occurred.

In certain embodiments, the radar monitor may be an FMCW sensor to determine a closeness or trajectory of the gripper hand to nearby surfaces. This FMCW sensor may be at a tip (e.g., most extreme end) of a gripper hand. In further embodiments, this FMCW sensor data from the FMCW sensor may be combined with other sensor data from another sensor, such as functional position sensor data from a functional position sensor, to more accurately calibrate a closeness or trajectory of the gripper hand to nearby surfaces. Examples of a functional position sensor may include any type of sensor capable of producing sensor data that characterizes a position of a gripper hand, such as an image sensor, a range finder, a radar monitor, or other types of sensors that may determine a position of a gripper hand relative to a surface.

As another example of an adverse condition, sensor data from a sensor may be collected and analyzed to determine whether an adverse condition such as a sensor failure has occurred. For example, sensor data that is either corrupted or nonexistent may be indicative of a failed sensor. More specifically, corrupted or nonexistent sensor data when sensor data is expected to be produced (e.g., during the operation of the gripper hand or during a period of activation for a sensor) may be indicative of a failed sensor. The sensor failure may be an adverse condition that indicates that part of the workstation (e.g., the gripper hand sensor) is damaged or is otherwise working improperly.

In certain embodiments, multiple sensors (e.g., gripper hand sensors) may be utilized on a gripper hand such that when a sensor failure occurs, another sensor (e.g., a backup sensor) may be activated to take over for the failed sensor. For example, when there are two gripper hand sensors (e.g., FMCW sensors, position sensors, or image sensors), the failure of one of the sensors may provoke the activation of the other sensor. As another example, when a position sensor experiences a sensor failure, another sensor (e.g., a FMCW sensor or an image sensor) may be activated to take over for the position sensor to collect sensor data in lieu of the position sensor.

As another example of an adverse condition, sensor data from an image sensor may be collected and analyzed to determine whether an adverse condition such as a fire or other abnormality is present from the image sensor data. For example, the gripper hand sensor functional module may analyze the image sensor data for indicia of a fire via conventional image analysis techniques.

As yet another example of an adverse condition, sensor data from a weight sensor may collect real time weight sensor data that characterizes a wafer weight to detect wafer chipping or breakages. For example, the gripper hand sensor functional module may monitor wafer weight sensor data and detect an adverse condition when the wafer weight is below a minimum weight threshold (which may be indicative of a chipped, broken, or incomplete wafer) or above a maximum weight threshold (which may be indicative of a wafer with an undesirable artifact on it, such as another wafer or an artifact that inadvertently fell on the intended wafer for transport by the gripper hand).

As yet another example of an adverse condition, sensor data from an electronic nose sensor may be analyzed to determine whether there is an undesirable presence of a particular molecule or molecular concentration of a particular molecule. For example, an adverse condition may be determined if sensor data from an electronic nose sensor detects an abnormal concentration of a particular gas.

As yet another example of an adverse condition, sensor data from a temperature sensor may be analyzed to determine where there is an abnormal condition during semiconductor processing, such as overheating or overcooling when an operational temperature detected by the temperature sensor exceeds a threshold value or is under a threshold value.

At operation 608, a robotic arm routine may be modified or adjusted by the workstation based on the detection of the adverse condition. Accordingly, as the gripper hand is moved, sensor data may be collected from the perspective of the gripper hand to ascertain whether an adverse condition is present so as to compensate for the detected adverse condition. In certain embodiments, upon detection of a particular adverse condition, the robotic arm routine may pause and/or move to a restart position. For example, upon detection of a robotic atm routine that detects an adverse condition (e.g., a distance of a gripper hand to a surface being below a threshold value), the robotic arm routine may be stopped and the robotic arm reset back (e.g., retracted) to an earlier position to restart or continue the robotic arm routine.

In particular embodiments, the robotic arm routine may be stopped for an indefinite period of time pending remediation of the detected adverse condition without moving to an earlier position. For example, certain types of adverse conditions (e.g., a failure of the robotic arm or a semiconductor processing chamber) may not be resolvable from a reboot, or restarting the robotic arm routine.

In further embodiments, the robotic arm routine may be adjusted upon detection of a particular adverse condition by reconfiguring the workstation to execute a different or a new robotic arm routine than the robotic arm routine being executed when the adverse condition was detected. For example, based upon detection of an adverse condition detected in a particular semiconductor processing chamber, the workstation may restart or continue in execution of a different robotic arm routine that avoids the semiconductor processing chamber in which the adverse condition was detected. As another example, based upon detection of an adverse condition characterized as a sensor failure, the workstation may activate backup gripper hand sensors that were previously not activated to take over for the gripper hand sensor that experienced the sensor failure.

Although particular adverse conditions, sensor data, and robotic arm routine adjustments are discussed above, other adverse conditions, sensor data, and robotic arm routine adjustments may be utilized in the performance of a gripper hand sensor process as desired for different applications in accordance with various embodiments. For example, a combination of different sensor data may be collected and cross referenced to determine the occurrence of an adverse condition.

In an embodiment, a system includes: an airlock; a first semiconductor processing chamber, a second semiconductor processing chamber; and a transfer module configured to move a sensor into and out of the first semiconductor processing chamber and the second semiconductor processing chamber, wherein the sensor is configured to: collect sensor data characterizing the first semiconductor processing chamber when within the first semiconductor processing chamber; and collect sensor data characterizing the second semiconductor processing chamber when within the second semiconductor processing chamber, wherein the transfer module, the first semiconductor processing chamber, and the second semiconductor processing chamber are within a controlled internal atmosphere on a first side of the airlock and separated by the airlock from an uncontrolled external atmosphere on a second side of the airlock.

In another embodiment, an apparatus includes: a robotic arm configured to move a wafer into and out of a first chamber and a second chamber, wherein the robotic arm comprises a sensor configured to: collect sensor data characterizing the first chamber when within the first chamber; and collect sensor data characterizing the second chamber when within the second chamber.

In another embodiment, a method includes: receiving a wafer at an airlock; converting air pressure in the airlock to equalize with a set pressure level; transferring, in an environment at the set pressure level, the wafer from the airlock to first semiconductor processing chamber; collecting first sensor data from a sensor at a gripper hand, the first sensor data characterizing the first semiconductor processing chamber when the wafer is within the first semiconductor processing chamber; transferring, in the environment at the set pressure level, the wafer from the first semiconductor processing chamber to a second semiconductor processing chamber; and collecting second sensor data from the sensor, the second sensor data characterizing the second semiconductor processing chamber when the wafer is within the second semiconductor processing chamber.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module"), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
   an airlock;
   a first semiconductor processing chamber,
   a second semiconductor processing chamber; and
   a transfer module configured to move at least one sensor into and out of the first semiconductor processing chamber and the second semiconductor processing chamber, wherein the transfer module comprises a gripper hand and the at least one sensor is mounted on a finger of the gripper hand, and wherein the at least one sensor is configured to:
      collect sensor data characterizing the first semiconductor processing chamber when within the first semiconductor processing chamber; and
      collect sensor data characterizing the second semiconductor processing chamber when within the second semiconductor processing chamber,
   wherein the transfer module, the first semiconductor processing chamber, and the second semiconductor processing chamber are within a controlled internal atmosphere on a first side of the airlock and separated by the airlock from an uncontrolled external atmosphere on a second side of the airlock, and
   wherein the at least one sensor comprises an electronic nose configured to measure a concentration of a gas molecule around the gripper hand, and wherein the at least one sensor further comprises a vacuum tip configured to bring gas molecules toward the electronic nose.

2. The system of claim 1, wherein the at least one sensor further comprises a radar monitor sensor.

3. The system of claim 1, wherein the transfer module comprises:
   a base;
   at least one link secured to the base;
   a gripper secured to the at least one link, wherein the gripper is configured to secure a wafer while the at least one link is in motion, and the gripper is configured to release the wafer while the at least one link is stopped.

4. The system of claim 3, wherein the at least one sensor is further configured to characterize a spatial relationship between the gripper and a surface of the first semiconductor processing chamber or the second semiconductor processing chamber.

5. The system of claim 1, wherein the sensor data characterizes a condition within the first semiconductor processing chamber or the second semiconductor processing chamber.

6. The system of claim 1, wherein the controlled internal atmosphere is less than a standard atmosphere (atm).

7. The system of claim 1, wherein the controlled internal atmosphere is $10^{-1}$ Torr to $10^{-3}$ Torr.

8. A system, comprising:
   a first chamber,
   a second chamber; and
   a robotic arm configured to move a wafer into and out of the first chamber and the second chamber, wherein the robotic arm comprises a gripper hand and at least one sensor is mounted on a finger of the gripper hand, and wherein the at least one sensor is configured to:
      collect sensor data characterizing the first chamber when within the first chamber; and
      collect sensor data characterizing the second chamber when within the second chamber, and
   wherein the at least one sensor comprises an electronic nose configured to measure a concentration of a gas molecule around the gripper hand, and wherein the at least one sensor further comprises a vacuum tip configured to bring gas molecules toward the electronic nose.

9. The system of claim 8, wherein the robotic arm, the first chamber, and the second chamber are within a controlled internal atmosphere on a first side of an airlock and separated by the airlock from an uncontrolled external atmosphere on a second side of the airlock.

10. The system of claim 9, wherein the airlock comprises a chamber between a first door and a second door, wherein only one door is configured to be open at any time.

11. The system of claim 8, wherein the at least one sensor further comprises a radar monitor sensor.

12. The system of claim 8, wherein the robotic arm comprises:
   a base;
   at least one link secured to the base;
   the gripper hand being secured to the at least one link, wherein:
      the gripper hand is configured to secure a wafer while the at least one link is in motion, and the gripper hand is configured to release the wafer while the at least one link is stopped.

13. The robotic arm of claim 12, wherein the at least one sensor is further configured to characterize a spatial relationship between the gripper hand and a surface of the first chamber or the second chamber.

14. The robotic arm of claim 8, wherein the sensor data characterizes a condition within the first chamber or the second chamber.

15. The robotic arm of claim 8, wherein the at least one sensor further comprises at least one of: a frequency modulated continuous wave (FMCW) device, a charge coupled device (CCD), a weight sensor, and an infrared range finder.

16. A method, comprising:
   receiving a wafer at an airlock;
   converting air pressure in the airlock to equalize with a set pressure level;
   transferring, in an environment at the set pressure level, the wafer from the airlock to first semiconductor processing chamber using a robotic arm having a gripper hand that holds the wafer;
   collecting sensor data characterizing the first semiconductor processing chamber when the wafer is within the first semiconductor processing chamber, wherein the sensor data comprises a concentration of a gas molecule around the gripper hand;
   transferring, in the environment at the set pressure level, the wafer from the first semiconductor processing chamber to a second semiconductor processing chamber; and
   collecting sensor data characterizing the second semiconductor processing chamber when the wafer is within the second semiconductor processing chamber; and
   vacuuming gas molecules with a vacuum tip configured to bring gas molecules toward an electronic nose coupled to the gripper hand.

17. The method of claim 16, further comprising:
   collecting sensor data characterizing a spatial relationship between the gripper hand and a surface of the first chamber or the second chamber.

18. The method of claim 16, further comprising:
   detecting an adverse condition based on the sensor data; and
   controlling the gripper hand in response to detecting the adverse condition.

19. The method of claim 18, further comprising:
   retracting the gripper hand to a restart position in response to the detecting the adverse condition.

20. The method of claim 16, wherein the sensor data further comprising at least one of: image data, distance data, temperature data, wafer weight data, and gripper hand movement speed.

* * * * *